United States Patent
Philliber et al.

(10) Patent No.: US 6,794,958 B2
(45) Date of Patent: Sep. 21, 2004

(54) METHOD OF FABRICATING A SEMICONDUCTOR DEVICE AND AN APPARATUS EMBODYING THE METHOD

(75) Inventors: Joel Alan Philliber, Pleasanton, CA (US); Richard C. Ruby, Menlo Park, CA (US)

(73) Assignee: Agilent Technologies, Inc., Loveland, CO (US)

( * ) Notice: Subject to any disclaimer, the term of this patent is extended or adjusted under 35 U.S.C. 154(b) by 21 days.

(21) Appl. No.: 10/202,974

(22) Filed: Jul. 25, 2002

(65) Prior Publication Data

US 2004/0017271 A1 Jan. 29, 2004

(51) Int. Cl.[7] .............................. H03H 9/54; H03H 9/60; H03H 9/02; H01L 23/06; H01L 23/10
(52) U.S. Cl. ...................... 333/189; 333/191; 333/192; 438/51; 257/684; 257/704
(58) Field of Search ................................ 333/186–192; 438/51, 53; 257/704, 723, 728, 678, 684, 688

(56) References Cited

U.S. PATENT DOCUMENTS

| | | | | |
|---|---|---|---|---|
| 4,736,128 A | * | 4/1988 | Takoshima et al. | 310/313 R |
| 5,608,362 A | * | 3/1997 | Nishimura et al. | 333/191 |
| 5,920,242 A | * | 7/1999 | Oya et al. | 333/189 |
| 5,939,956 A | * | 8/1999 | Arimura et al. | 333/189 |
| 6,157,076 A | * | 12/2000 | Azotea et al. | 257/679 |

FOREIGN PATENT DOCUMENTS

| | | | |
|---|---|---|---|
| JP | 8-191230 | * | 7/1996 |
| JP | 11-274886 | * | 10/1999 |

* cited by examiner

Primary Examiner—Barbara Summons

(57) ABSTRACT

A method for fabricating an apparatus, and an apparatus embodying the same is disclosed. First a device chip having circuit elements is fabricated. Next, a cap with a cap circuit is fabricated. Finally, the cap is placed on the device chip to connect a first contact point with a second contact point using the connector on the cap. The apparatus includes a device chip and a cap. The device chip has the first contact point and a second contact point. The cap has the cap circuit that, when the cap is placed on the device chip, connects the first contact point with the second contact point.

20 Claims, 4 Drawing Sheets

METHOD OF FABRICATING A SEMICONDUCTOR DEVICE AND AN APPARATUS EMBODYING THE METHOD

BACKGROUND

The present invention relates to semiconductor circuit fabrication technology, and more particularly, to connection and protection of various circuit elements using a cap.

Semiconductor circuits and devices are typically manufactured by depositing and patterning one layer at a time. Beginning at a bottom layer, each layer is deposited and then patterned using an etching technique before any subsequent layers are deposited. A popular etching technique includes a number of steps. First, the entire layer is covered using photoresist material. Next, portions of the photoresist material are exposed to radiation (such as ultraviolet light) in a desired pattern. Then, the exposed portions of the photoresist are removed and portions of the layer under the removed portions of the photoresist are also removed. Remaining portions of the layer form the desired pattern and has the non-exposed portions of the photoresist covering the remaining portions of the layer. Finally, the photoresist over the remaining portions of the layer is removed. This process allows the patterning of each layer such that any one layer can overlap any and all other layers fabricated before, or under, that one layer.

For example, FIGS. 1A and 1B illustrate a device 110 having two resonators 120 (first resonator) and 130 (second resonator) fabricated over a substrate 112. FIG. 1A is a top view of the device 110 and FIG. 1B is a cutaway cross-sectional side view of the device 110, cut along line A—A of FIG. 1A.

Here, bottom electrode layers 122 and 132 were fabricated by first depositing a single bottom electrode layer covering the entire substrate 112 and then patterning that single bottom electrode layer using an etching technique. Above the bottom electrodes 122 and 132, a crystalline layer 114 is fabricated using a similar deposit-and-etch technique. Above the crystalline layer 114, a top electrode layer 116 is fabricated again using a similar deposit-and-etch technique.

However, for some purposes, the application of the deposit-and-etch technique may have undesirable consequences. For example, in thin film bulk acoustic resonator (FBAR) manufacturing processes, quality of the crystalline layer 114 may vary widely depending on residual photoresist remaining from the etching process of the previous layer. Further, the crystalline layer 114 may develop gaps or cracks when fabricated over an edge, for example edge 115, of its underlying layer. Such cracks or gaps lead to susceptibility to electrostatic discharges.

Accordingly, there remains a need for a technique of fabricating semiconductor devices that overcomes these problems and an apparatus embodying the method.

SUMMARY

The need is met by the present invention. According to a first aspect of the present invention, a method of fabricating an apparatus is disclosed. First, a device chip is fabricated, the device chip including circuit elements fabricated on a substrate and also including a first contact point and a second contact point. Next, a cap is fabricated including a connector. Finally, the cap is placed on the device chip where the connector makes contact with the first contact point and the second contact point.

According to a second aspect of the present invention, an apparatus includes a device chip including circuit elements fabricated on a substrate and a cap. The device chip has a first contact point and a second contact point. The cap covers at least a portion of the device chip. Further, the cap has a connector for connecting the first contact point and the second contact point of the device chip.

According to a third aspect of the present invention, an apparatus includes a device chip and a cap. The device chip includes a substrate and circuit elements fabricated on the substrate. The device chip also includes a first resonator and a second resonator, each resonator having its own bottom electrode, piezoelectric material, and top electrode, each top electrode connected to a landing pad. The cap has a connector connecting landing pad of the first resonator to landing pad of the second resonator.

Other aspects and advantages of the present invention will become apparent from the following detailed description, taken in combination with the accompanying drawings, illustrating by way of example the principles of the invention.

DETAILED DESCRIPTION

Figure 1A:
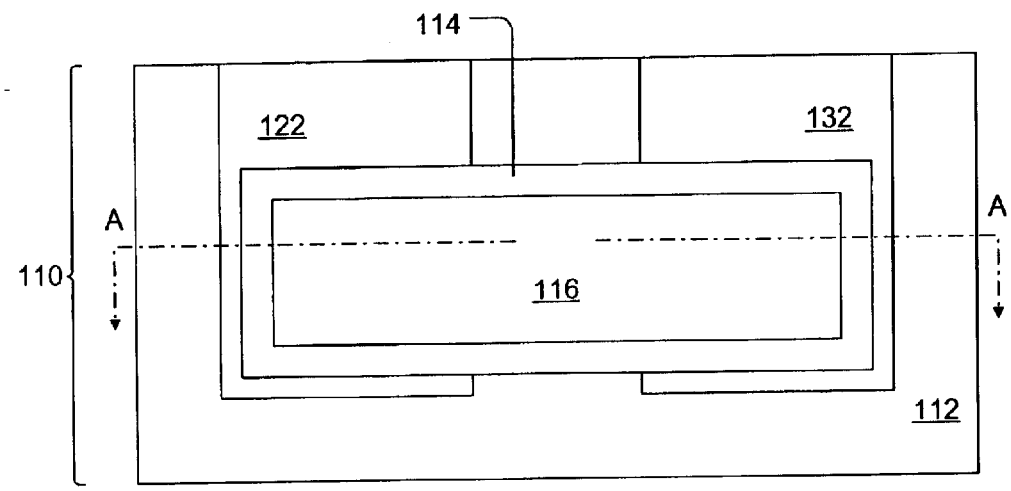
FIG. 1A is a simplified top view of a device including two resonators.

As shown in the drawings for purposes of illustration, the present invention is embodied in an apparatus including a device chip and a cap. The device chip has a first contact point and a second contact point. The cap, covering at least a portion of the device chip, has a connector for connecting the first contact point and the second contact point.

The connector on the cap can be used to connect various parts of the device chip. Consequently, the need to fabricate overlapping layers on the device chip is reduced or eliminated. In fact, it is possible to abandon the application of the deposit-and-etch technique of fabricating the layers in favor of another technique (such as a top-down technique, discussed below) suited to a particular apparatus.

Figure 2A:
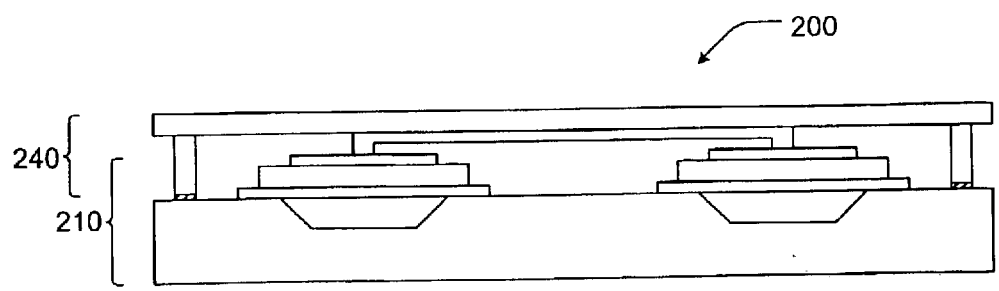
FIG. 2A is a cross sectional cutaway view of an apparatus according to one embodiment of the present invention.
Figure 2B:
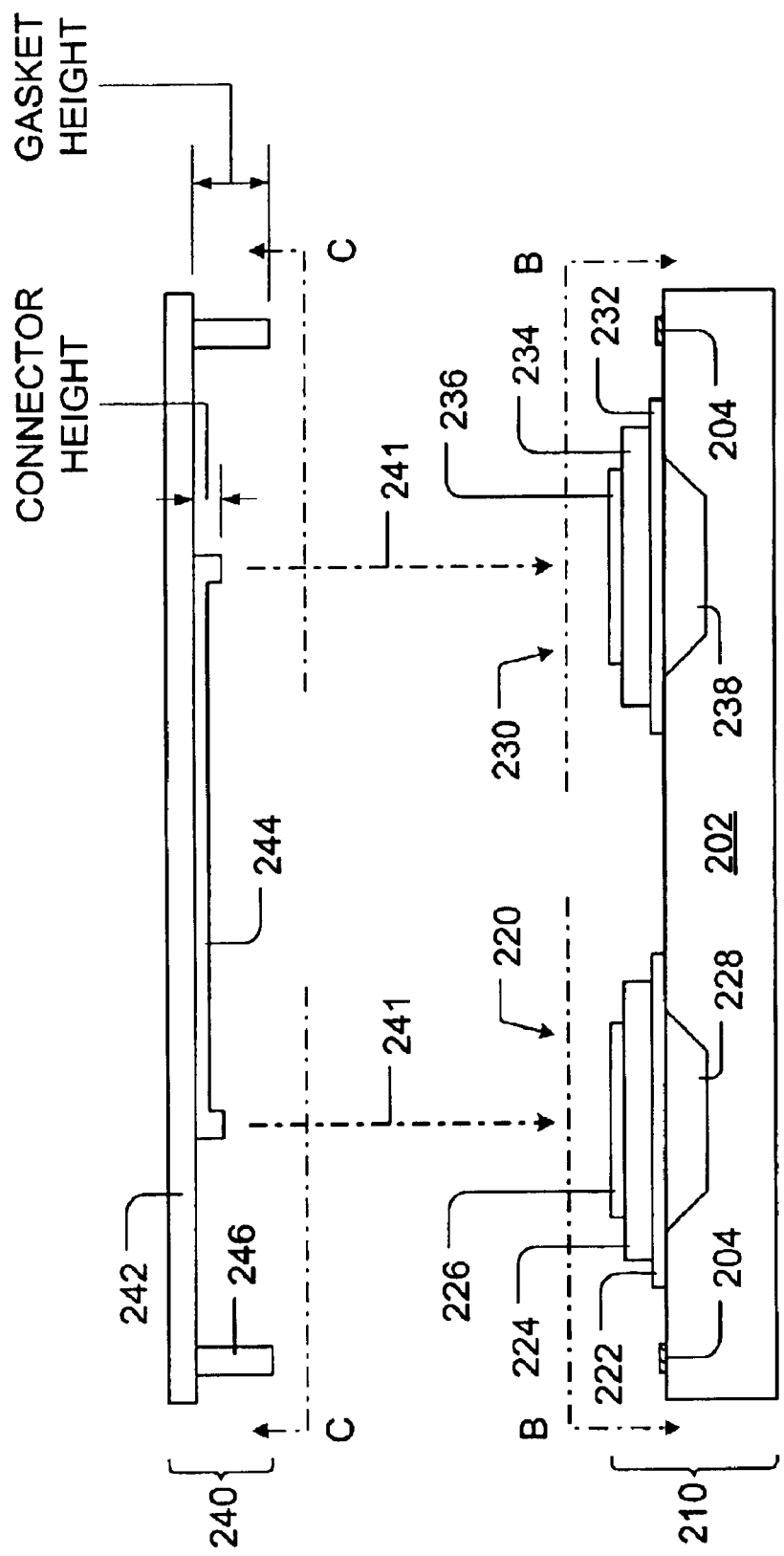
FIG. 2B is another view of the apparatus of FIG. 2A with cap separated from device chip portion of the apparatus.
Figure 2C:
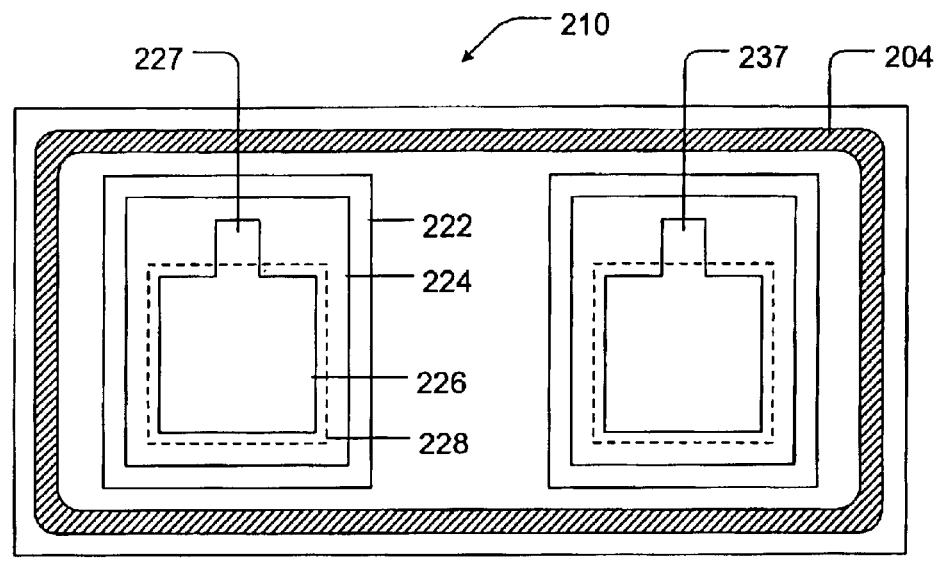
FIG. 2C is a top view of the device chip portion of the apparatus of FIG. 2B viewed from line B—B of FIG. 2B.
Figure 2D:
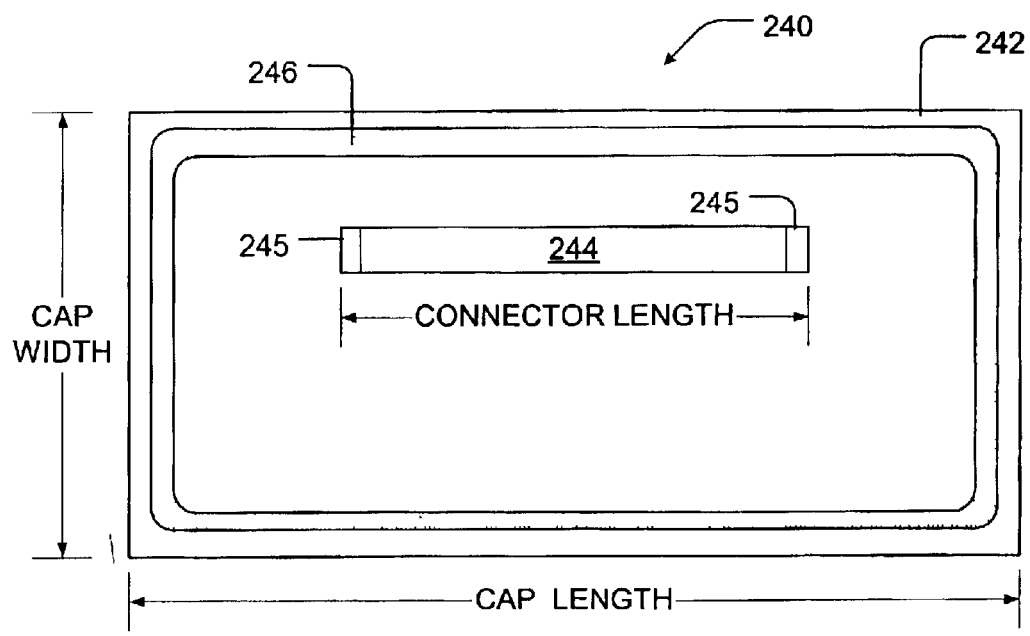
FIG. 2D is a bottom view of the cap of the apparatus of FIG. 2B viewed from line C—C of FIG. 2B.
Figure 2E:
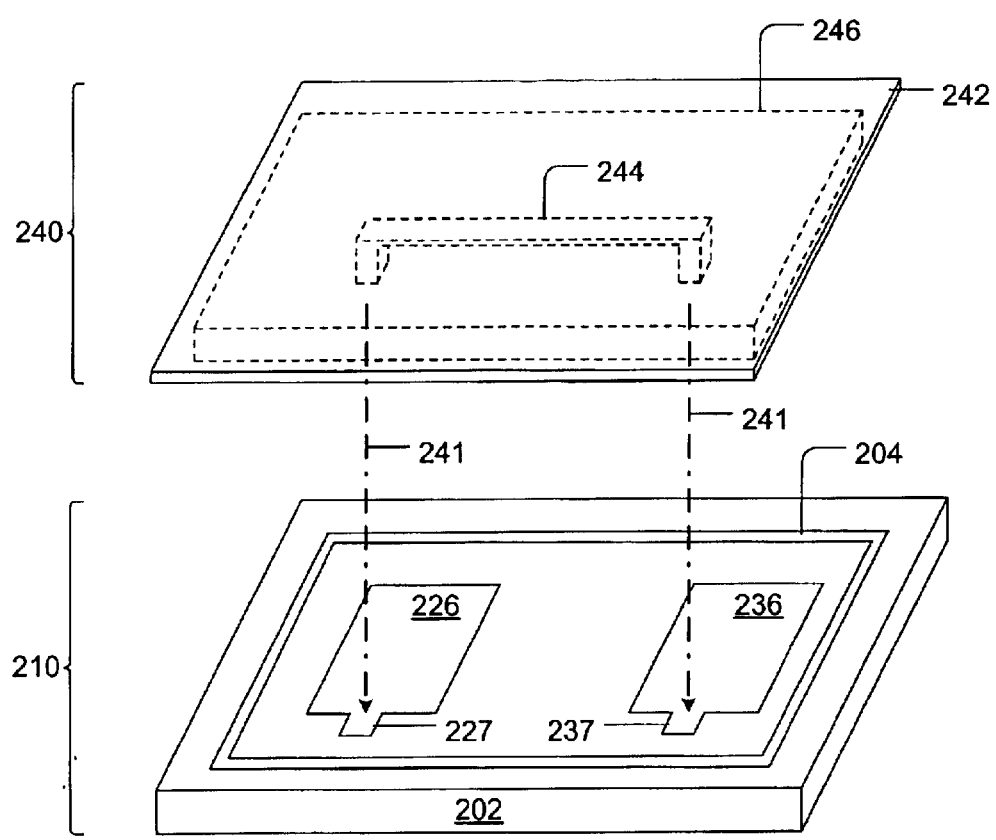
FIG. 2E is a simplified perspective view of the apparatus of FIG. 2B.

For example, FIG. 2A illustrates an apparatus 200 manufactured according to one embodiment of the present invention. FIG. 2A is a cross sectional cutaway view of the apparatus 200 having a device chip 210 and a cap 240. FIG. 2B illustrates the same apparatus 200 as FIG. 2A but with the device chip 210 and the cap 240 separated for convenience of illustration. FIG. 2C is a top view of the device chip 210 of the apparatus 200 of FIG. 2B viewed from line B—B of FIG. 2B. FIG. 2D is a bottom view of the cap 240 of the apparatus 200 of FIG. 2B viewed from line C—C of FIG. 2B. FIG. 2E is a simplified perspective view of the apparatus 200 of FIG. 2B.

Referring to FIGS. 2A through 2E, inclusive, the device chip 210 includes a device chip substrate 202 on which circuit elements have been fabricated. In the present example, the device chip 210 includes a first thin-film bulk resonators (FBAR) 220 and a second thinfilm bulk resonators (FBARs) 230, respectively.

The first FBAR 220 has a first bottom electrode 222 and a first top electrode 226 sandwiching first piezoelectric material 224. The first FBAR 220 may be fabricated over a first cavity 228 to enhance resonance of the first FBAR 220. The electrodes 222 and 226 are made of conducting material such as Molybdenum. The first piezoelectric material 224 is Aluminum Nitride (AlN) in one possible embodiment.

Likewise, the second FBAR 230 has a second bottom electrode 232 and a second top electrode 236 sandwiching second piezoelectric material 234. The second FBAR 230 220 may be fabricated over a second cavity 238 to enhance resonance of the second FBAR 230. The electrodes 232 and 236 are made of conducting material such as Molybdenum. The second piezoelectric material 234 is Aluminum Nitride (AlN) in one possible embodiment.

The first top electrode 226 is connected to a first landing pad 227. In the present example, the first landing pad 227 functions as a first contact point 227 for a cap circuit 244 fabricated on a cap substrate 242. Likewise, the second top electrode 236 is connected to a second landing pad 237. The second landing pad 237 functions as a second contact point 237 for the cap circuit 244 fabricated on the cap substrate 242. For simplicity and clarity, in the Figures and discussions herein, the cap circuit 244 is illustrated as a simple connector 244. However, it is to be understood that the cap circuit 244 can be any combination of circuits or circuit elements.

In an alternative embodiment, the first top electrode 226 and the second top electrode 236 function as the first contact point and the second contact point, respectively.

The cap 240 is fabricated to include a cap substrate 242 and the cap circuit (herein after the "connector") 244 fabricated on the cap substrate 242. The cap 240 also includes a gasket 246 for sealing the cap 240 onto the device chip 210.

The cap 240, the gasket 246, and the connector 244 are fabricated using known semiconductor fabrication technology using photoresist masking and etching steps. The cap 240 and the gasket 246 are typically made of the same silicon substrate material by a series of masking and etch steps. The size and the shape of the cap 240 can vary widely depending upon the requirements of the application. In experiments, caps having widths and lengths ranging from 0.1 millimeters (mm) to several millimeters have been produced. The cap 240 is generally rectangular in shape; however, this is not necessary and can be any shape.

The connector 244 is fabricated using similar deposit and etch technology. A conductive metal such as gold is used to fabricate the connector 244. The Figures illustrate one embodiment of the connector 244 having raised areas 245. In an alternative embodiment, the connector 244 can be fabricated without the raised areas 245 that still make contact with the contact points. The width and the length of the connector 244 depend on application. In experiments, connectors having widths and lengths ranging from 10 to 40 microns have been successfully used. The height of the connector 244 depends on the distance between the contact points and the cap. In experiments, connectors having heights, or thickness, ranging less than 10 microns have been used.

The cap 240 is aligned on the device chip 210 as illustrated by arrows 241. When placed on the device chip 210, the cap 240 covers at least a portion of the device chip 210. In the present example as illustrated by FIGS. 2A through 2E, the cap 240 covers most of the device chip 210. Further, when the cap 240 is placed on the device chip 210, a first end of the connector 244 makes contact with the first contact point 227 and a second end of the connector 244 makes contact with the second contact point 237 thereby connecting the first resonator 220 with the second resonator 240.

Figure 1B:
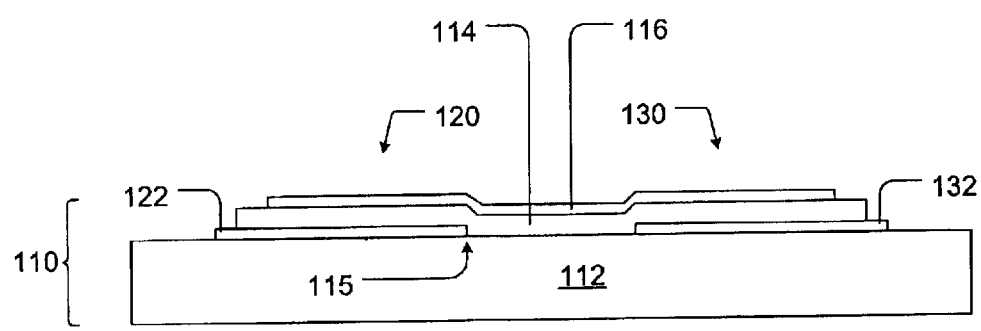
FIG. 1B is a cross sectional cutaway view of the device of FIG. 1A cut along line A—A.

In the illustrated embodiment, the connector 244 is used to connect the top electrodes 226 and 236 of the resonators 220 and 230. Consequently, the top electrodes 226 and 236 do not need to be a part of a connected top electrode layer (such as the top electrode layer 116 of FIGS. 1A and 1B) overlapping the layers underneath it. Therefore, in fabricating the device chip 210, the deposit-and-etch technique can be replaced with a top-down fabrication technique.

In the top-down technique, a bottom layer is deposited and a top layer is deposited without etching the bottom layer. Then, the top layer is etched first before etching the bottom. Because the bottom layer is not etched before the top layer, there can be no residual photoresist between any two layers. In fact, under the top-down technique, no layer is exposed to the environment prior to the deposition of the next layer minimizing contamination between the layers. Further, this process allows the entire film stack to be deposited in a single, multi-chamber deposition system.

However, because the top layer is etched before the bottom layer, the top layer cannot overlap over multiple portions of the bottom layer. The top layer covers an area that is smaller than or at most equal to the bottom layer. That is, the top layer cannot overlap between separate portions of the bottom layer. Consequently, different portions of the top layer cannot be connected. In the present invention, these portions are connected by the connector 244.

In the example as illustrated in FIGS. 2A through 2E, inclusive, the device chip 210 is fabricated using the top-down technique. First all three layers—a bottom electrode layer, a piezoelectric layer, and a top electrode layer—are deposited, in that order, on the substrate 202. Then, the resonators 220 and 230 are formed by from the top layer. That is, the top electrode layer is etched first removing all but the first top electrode 226, the second top electrode 236, the first landing pad 227, and the second landing pad 237. Next, the piezoelectric layer is etched removing all but the first piezoelectric material 224, and the second piezoelectric material 234. Finally, the bottom electrode layer is etched removing all but the first bottom electrode 222, and the second bottom electrode 232.

Of course, in the illustrated embodiment, before any of these steps are taken, the cavities 228 and 238 are dug and filled with sacrificial material, for example phosphorus doped silicate glass. After the resonators 220 and 230 are fabricated, the sacrificial material is removed using various known techniques create the air cavities 228 and 238.

In the illustrated apparatus 210, there can be no residual photoresist between any of the three layers because no layer is etched before deposition of all the layers. Further, no layer overlaps another or fabricated over an edge of a previously fabricated layer. Therefore, problems with gaps or cracks are avoided. FBAR fabrication processing technology is well known in the art. In the current art, the FBAR resonators 220 and 230 can have lengths and widths ranging in the order of 10's or 100's microns with thickness of the electrodes or piezoelectric layers ranging in the order of 100's to 1,000's of nanometers.

Continuing to refer to FIGS. 2A through 2E, inclusive, the gasket 246 surrounds the resonators 220 and 230 hermetically sealing the resonators 220 and 230 such that the resonators 220 and 230 are protected. Further, the gasket 246, having a finite thickness, acts as a spacer to elevate the cap 240 to allow the connector 244 to properly contact the landing pads 227 and 237. In a sample embodiment, the gasket 246 has a width in a range of four to 30 microns and thickness, or height, in a range of five to 50 microns. The thickness of the gasket, or the gasket height, in this instance, is the distance between the device chip and the cap. Typically, the gasket 246 is made from the same material as the cap substrate 242 which is often silicon.

The device chip 210 includes adhesive 204 to facilitate adhesion of the gasket 246 to the substrate 202 of the device chip 210 resulting in a better seal. For adhesive, polymide or benzocyclobutene (BCB) can be spun on the device chip 210 as known in the art.

From the foregoing, it will be appreciated that the present invention is novel and offers advantages over the current art. Although a specific embodiment of the invention is described and illustrated above, the invention is not to be limited to the specific forms or arrangements of parts so described and illustrated. For example, differing configurations, sizes, or materials may be used to practice the present invention. In particular, in the illustrations, a device chip having two resonators is connected by the cap and sealed by the gasket; however, the present invention is not limited to such a device chip. The invention is limited by the claims that follow.

What is claimed is:

1. A method of fabricating an apparatus, the method comprising:
   fabricating a device chip including circuit elements fabricated on a substrate, said device chip having a first contact point and a second contact point;
   fabricating a cap, said cap including a cap circuit;
   placing said cap on said device chip whereby said cap circuit makes contact with said first contact point and said second contact point wherein said device chip is fabricating using top-down technique.

2. A method of fabricating an apparatus, the method comprising:
   fabricating a device chip including circuit elements fabricated on a substrate, said device chip having a first contact point and a second contact point and the circuit elements including a thin film resonator;
   fabricating a cap, said cap including a cap circuit;
   placing said cap on said device chip whereby said cap circuit makes contact with said first contact point and said second contact point wherein said contact is made between the cap circuit and a top electrode of said thin film resonator.

3. The method recited in claim 2 further comprising fabricating a landing pad on said device chip for making said contact.

4. The method recited in claim 2 wherein said thin film resonator includes a landing pad for making said contact with said cap circuit.

5. The method recited in claim 2 wherein said first contact point is an electrode on a thin film resonator.

6. The method recited in claim 2 wherein said cap comprises a substrate and wherein said cap circuit comprises conducting material.

7. An apparatus comprising:
   a device chip including circuit elements fabricated on a substrate, said device chip having a first contact point and a second contact point;
   a cap covering at least a portion of said device chip, said cap having a cap circuit for electrically connecting said first contact point and said second contact point of said device chip; and
   said cap including a gasket for sealing said cap onto said device chip.

8. The apparatus recited in claim 7 wherein said device chip includes a resonator circuit.

9. The apparatus recited in claim 8 wherein the gasket surrounds the resonator and said cap hermetically seals the resonator.

10. The apparatus recited in claim 7 wherein the gasket elevates said cap over said circuit elements for a proper seal of said cap with said device chip.

11. An apparatus comprising:
    a device chip including circuit elements fabricated on a substrate, said device chip having a first contact point and a second contact point;
    a cap covering at least a portion of said device chip, said cap having a cap circuit for connecting said first contact point and said second contact point of said device chip;
    said device chip including a first thin film resonator; and
    said first contact point is a top electrode of said first thin film resonator.

12. The apparatus recited in claim 11 wherein device chip includes a second thin film resonator having a top electrode.

13. The apparatus recited in claim 11 wherein said thin film resonator includes a landing pad as said first contact point.

14. The apparatus recited in claim 11 wherein said first contact point is an electrode on a thin film resonator.

15. The apparatus recited in claim 11 wherein said cap comprises a substrate and wherein said cap circuit comprises conducting material.

16. The apparatus recited in claim 11 wherein said device chip is fabricated using top-down technique.

17. An apparatus comprising:
    a device chip including a substrate and circuit elements fabricated on said substrate, said device chip also including a first resonator and a second resonator, each resonator having its own bottom electrode, piezoelectric material, and top electrode, each top electrode connected to a landing pad; and
    a cap having a cap circuit connecting landing pad of said first resonator to landing pad of said second resonator.

18. The apparatus recited in claim 17 wherein said first resonator is a thin film resonator.

19. The apparatus recited in claim 18 wherein said a first landing pad is connected to the top electrode of said first thin film resonator.

20. The apparatus recited in claim 17 wherein said device chip is fabricated using top-down technique.

* * * * *